United States Patent [19]

Townsend

[11] 4,347,740

[45] Sep. 7, 1982

[54] CAPACITIVE LEVEL SENSING DEVICE

[75] Inventor: Lawrence B. Townsend, Downers Grove, Ill.

[73] Assignee: Magnetrol International, Incorporated, Downers Grove, Ill.

[21] Appl. No.: 93,392

[22] Filed: Nov. 13, 1979

[51] Int. Cl.³ .................. G01F 23/26; G01R 27/26
[52] U.S. Cl. ........................... 73/304 C; 324/60 C; 324/61 QS; 331/65
[58] Field of Search .............. 73/304 C; 331/65; 324/61 QS, 61 R, 61 P

[56] References Cited

U.S. PATENT DOCUMENTS

| | | | |
|---|---|---|---|
| Re. 28,596 | 10/1975 | Siegel | 310/8.1 |
| 3,000,101 | 9/1961 | Giardino et al. | 324/61 R X |
| 3,042,908 | 7/1962 | Pearson | 331/65 X |
| 3,153,205 | 10/1964 | Jones et al. | 331/65 X |
| 3,375,716 | 4/1968 | Hersch | 73/304 C |
| 3,392,349 | 7/1968 | Bartley | 73/304 C X |
| 3,553,575 | 1/1971 | Shea | 340/620 X |
| 3,646,541 | 2/1972 | Rathbun | 331/65 X |
| 3,747,407 | 7/1973 | Wallman | 73/304 C |
| 4,001,723 | 1/1977 | Sheng | 331/111 |
| 4,002,996 | 1/1977 | Klebanoof | 73/304 C |
| 4,013,065 | 3/1977 | Copeland et al. | 73/73 |
| 4,038,871 | 8/1977 | Edwards | 73/304 C |
| 4,083,248 | 4/1978 | Maier | 73/304 C |
| 4,133,543 | 1/1979 | Ohboro | 73/304 C X |
| 4,228,393 | 10/1980 | Pile | 331/65 X |
| 4,259,632 | 3/1981 | Athiainen | 324/61 R |

OTHER PUBLICATIONS

Publ. "Simple OP-Amp Multivibrator Oscillator", Electronotes Mus. Eng. Group, Note No. 28, Feb. 25, 1977, pp. AN-1, AN-2.

Primary Examiner—Daniel M. Yasich
Attorney, Agent, or Firm—Wegner, McCord, Wood & Dalton

[57] ABSTRACT

A capacitance sensing circuit utilizes an operational amplifier connected in a comparator configuration. The capacitance to be measured is connected to one input of the operational amplifier and is also connected to the output of the operational amplifier through a resistor to form a free-running multivibrator. The period of the multivibrator output depends upon the value of capacitance being measured. A switching transistor is connected to the output of the operational amplifier to cause a changing current output signal. The output signal is obtained as a change of current in a current sensor connected to the collector of the transistor.

3 Claims, 1 Drawing Figure

CAPACITIVE LEVEL SENSING DEVICE

BACKGROUND OF THE INVENTION

1. Field of the Invention

This invention relates to a sensing device for measuring the value of an unknown capacitance, and more particularly, to a level sensing device using a capacitance whose value is dependent upon the level of liquid in a tank.

2. Description of the Prior Art

Previously proposed sensing systems, such as U.S. Pat. No. 4,083,248, incorporate the use of a capacitive probe in combination with a pair of threshold detectors. The capacitance is connected to timing circuitry which includes the threshold detectors. Such a level sensing system using more than one threshold detector suffers from the disadvantage of being sensitive to temperature changes which is reflected as an instability in the period of the output wave form. Furthermore, the prior system is relatively expensive because it requires the use of more than one operational amplifier.

It is an object of the invention to provide an improved capacitive level sensing device with only a single operational amplifier so as to be insensitive to temperature changes.

It is another object of the invention to provide a capacitive level sensing device which utilizes a small number of parts resulting in a lower cost capacitance transmitter with good stability over a wide temperature range.

SUMMARY OF THE INVENTION

The object of the invention is achieved by providing a single level detector to process the capacitive probe output.

According to the invention, there is provided a capacitance sensing device, comprising a capacitive probe for insertion in a liquid process tank having a capacitance variable in response to the level of liquid in the tank. An operational amplifier connected to form a comparator has a reference voltage connected to one input. The probe capacitance is coupled to the output of the operational amplifier through a charging resistor and is also connected to the other input of the operational amplifier. The circuit operates as a free-running multivibrator, the period of which is dependent upon the capacitance of the probe within the tank. The output of the comparator is connected to a switching transistor which in turn drives a current sensor through a coaxial or twinaxial cable. The output signal from the current sensor is sent to other circuitry for further processing.

BRIEF DESCRIPTION OF THE DRAWINGS

A capacitance sensing device embodying the invention will now be described by way of example with reference to the accompanying drawing, the sole FIGURE of which is a schematic diagram of the system.

DESCRIPTION OF THE PREFERRED EMBODIMENT

Figure 1:
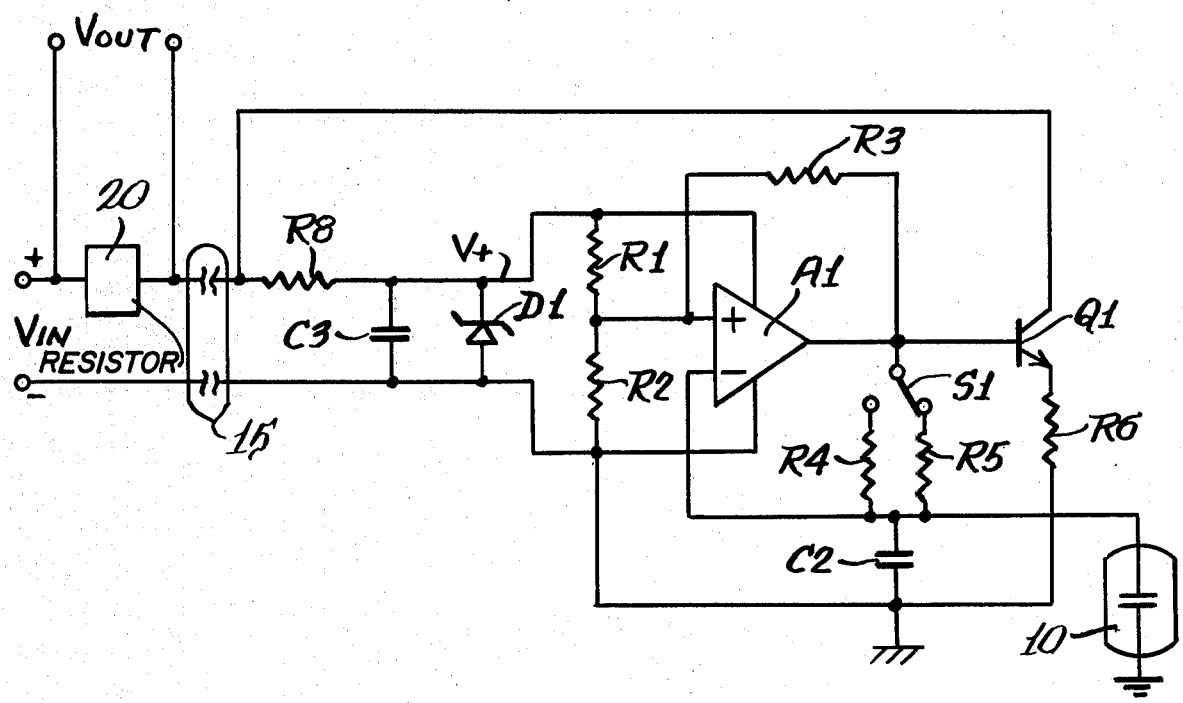

Referring to the FIGURE, a probe capacitance 10 is mounted in a process tank, the level of liquid inside of which is to be detected. The capacitance of the probe 10 depends upon a variable condition, for example, the level of the liquid within the process tank.

The probe capacitance 10 is connected to the negative input of an operational amplifier A1. A reference signal to the positive input of operational amplifier A1 is derived from the junction of a voltage divider network consisting of resistors R1 and R2 connected between a regulated voltage supply V+ and a source of reference potential, or ground. Feedback is provided by a resistor R3 connected between the output of operational amplifier A1 and its noninverting input. The purpose of feedback resistor R3 is to provide hysteresis so that the output of operational amplifier A1 rapidly changes states when the voltages appearing at its noninverting and inverting inputs closely approximate one another.

A range switch S1 connects one of two resistors R4 or R5 to the negative input of operational amplifier A1 to limit the maximum period range for a wide range of capacitances. A period limiting capacitor C2 is connected between the inverting input of operational amplifier A1 and ground potential to limit the minimum period.

The operational amplifier A1 and its associated circuitry form a free-running multivibrator, the period of which is determined by the probe capacitance 10 and by the selection of resistor R4 or R5.

When the voltage on the positive input of operational amplifier A1 is greater than the voltage on the negative input, the output of operational amplifier A1 will be a high state, i.e., to within a millivolt of supply voltage V+. This voltage is coupled to the capacitance probe 10 through one of the resistors R4 or R5, depending upon the position of the range switch S1. The probe capacitance 10 will begin to charge to this voltage with a time constant determined by the value of resistance of R4 or R5 times the capacitance of the probe 10. The presence of resistor R3 forces the positive input to operational amplifier A1 to assume a higher voltage than would be the case if R3 were not present, e.g., for a twelve-volt supply, the voltage on the positive input of operational amplifier A1 is ten volts. Therefore, the output of operational amplifier A1 does not change states until the voltage appearing across the probe capacitance, i.e., the voltage appearing at the inverting input of operational amplifier A1, exceeds the voltage appearing at the noninverting input. When this condition is met, the output of operational amplifier A1 switches to within a millivolt of ground potential.

The noninverting input to operational amplifier A1 is pulled down to a low value by the presence of resistor R3, e.g., for a twelve-volt supply, the voltage appearing at the noninverting input of operational amplifier A1 is approximately two volts. The probe capacitance 10, in the meantime, is discharging through resistor R4 or R5 to the output of operational amplifier A1 which is close to ground potential. As soon as the probe capacitance 10 discharges to a voltage slightly less than that appearing at the noninverting input of operational amplifier A1, the output of the operational amplifier A1 again switches to a high state, i.e., to within a few millivolts of supply potential V+. The output of operational amplifier A1 will continue to switch in this manner, and the period of this switching is determined by the time constant of the RC network, i.e., by the probe capacitance 10 and the selection of either resistor R4 or R5.

Capacitor C2 acts to limit the period of the output signal at some predetermined lower limit. If the probe capacitance 10 falls to a very low value, capacitor C3 prevents the output from oscillating with a period below a certain minimum. The capacitor C2 may be varied depending upon the system and output circuitry requirements.

A bipolar transistor is used to provide output current information from the output of operational amplifier A1, and a current-limiting resistor R6, used to adjust this current, is connected between the emitter of Q1 and ground potential. The collector of Q1 is connected back to the power supply, indicated as $V_{in}$, through a variable length transmission line 15, then through a current sensor 20 which may be, for example, a resistor. A voltage regulating circuit consisting of resistor R8, capacitor C3, and Zener diode D1 provides regulated voltage to the various components of the device.

Transistor Q1 inverts the output of operational amplifier A1 and generates a current signal to the current sensor through the transmission line 15. The voltage supply which generates the voltage $V_{in}$ has a capacitor connected across its terminals (not shown) which grounds any AC signals which may be present. Therefore, current sensor 20 is connected between the collector of Q1 and ground potential. Hence, the output signal of the device, labeled $V_{out}$, can be taken across this current sensor. The signal thus taken can be further processed by suitable circuitry to provide the desired information.

Resistors R4 and R5 are selected to provide suitable ranges of periods corresponding to the expected range of capacitance values. The two resistors may differ by a factor of 10 to provide an output signal that can be adapted for use with various capacitive load ranges.

The various components of the system are supplied with regulated voltage by resistor R8 and capacitor C3 which form an RC filter and by Zener diode D1 connected in parallel with capacitor C3. The RC filter integrates the voltage from $V_{in}$, and provides a smoothed voltage signal to Zener diode D1, and hence operational amplifier A1. If the voltage at the output of the RC filter attempts to exceed the Zener breakdown voltage of the diode D1, D1 conducts and holds the output voltage at its breakdown level. This semiconstant voltage is then delivered to operational amplifier A1 and to the voltage divider network consisting of resistors R1 and R2.

The circuit has a high temperature stability due to its single operational amplifier construction. Errors due to leakage current and offset voltage affect the capacitor charge and discharge in identical manner resulting in no net change in the period. For example, if the supply voltage V+ delivered to the operational amplifier A1 changes by ten millivolts, the voltage on the noninverting input, when the output is high, would change to approximately 10.010 volts and the voltage on the noninverting input, when the output is low, would change to approximately 2.010 volts. The differential remains the same and the time required to charge and discharge through one cycle remains unchanged. This is not the case with level detectors which utilize two operational amplifiers in which drift of the input voltage on one operational amplifier can change the period of the output waveform and thereby provide a false indication of the capacitance to be measured.

I claim:

1. A capacitance sensing circuit comprising:
   a voltage comparator with two inputs and an output, said output having either a high or a low state depending on the relative value of signals at said inputs;
   a reference signal source connected with one of said inputs;
   an unknown capacitor connected with the other of said inputs;
   a resistor connected between said output and said other input, said capacitor charging and discharging through said resistor to develop a signal which causes said comparator output to change state and develop an output signal having a period which depends on the capacitance of said unknown capacitor;
   a transistor having a collector connected to the output of said comparator; and
   a current sensor connected to said collector so that a signal having the same period as the output signal is developed across said current sensor.

2. A level sensing device for developing an output signal whose period is indicative of the level of a liquid in a tank, comprising:
   a comparator having a noninverting and an inverting input and having an output capable of assuming a high or low state to form said output signal in accordance with the relative values of voltages at the inputs;
   a reference voltage source for providing a reference voltage to one of said inputs;
   a capacitor variable in response to the level of the liquid connected to the other of said inputs;
   a charging resistor connected between said output and said other input, said variable capacitor charging and discharging through said charging resistor to cause said comparator to change state with the period of said output signal depending upon the level of said liquid in said tank;
   a second capacitor of known value connected in parallel with said variable capacitor so that the period of said output signal remains above a particular value regardless of the value of said variable capacitor;
   a transistor having a collector connected to the output of said comparator; and
   a current sensor connected to said collector so that a signal having the same period as the output signal is developed across said current sensor.

3. The level sensing device of claim 2, further including a second charging resistor connectable between said output and said variable capacitor wherein a switch is connected between said output of said comparator and one of said charging resistors to select one of said charging resistors so that said period of said output signal falls within a predetermined range.

* * * * *